US008901940B2

(12) United States Patent
Provenzano et al.

(10) Patent No.: US 8,901,940 B2
(45) Date of Patent: Dec. 2, 2014

(54) RESISTOR STORAGE CAVITY IN PLUG OF SENSING EDGE

(75) Inventors: Jack Provenzano, Hatfield, PA (US); Vinay Sao, Malvern, PA (US); Krishnaraj Tejeswi, Exton, PA (US)

(73) Assignee: Miller Edge, Inc., West Grove, PA (US)

( * ) Notice: Subject to any disclaimer, the term of this patent is extended or adjusted under 35 U.S.C. 154(b) by 277 days.

(21) Appl. No.: 13/252,660

(22) Filed: Oct. 4, 2011

(65) Prior Publication Data

US 2012/0081130 A1 Apr. 5, 2012

Related U.S. Application Data

(60) Provisional application No. 61/389,786, filed on Oct. 5, 2010.

(51) Int. Cl.
*G01R 27/28* (2006.01)
*E05F 15/00* (2006.01)

(52) U.S. Cl.
CPC ......... *E05F 15/006* (2013.01); *E05Y 2800/404* (2013.01); *E05Y 2600/40* (2013.01)
USPC .................. 324/649; 324/76.11; 324/207.11; 29/850; 29/849; 29/622; 29/28; 250/221; 250/222.1; 200/61.43; 200/85 R; 200/61.73

(58) Field of Classification Search
USPC ........ 324/469, 76.11, 649, 207.11; 49/26–28, 49/160, 199, 403, 622, 482.1, 493.1, 506, 49/849, 850; 200/61.43, 837, 85 R, 61.73, 200/221, 86 R; 250/221, 222.1
See application file for complete search history.

(56) References Cited

U.S. PATENT DOCUMENTS 3,133,167 A 5/1964 Miller
3,855,733 A 12/1974 Miller (Continued)

FOREIGN PATENT DOCUMENTS

CA 1174902 A1 9/1984
DE 9414962 U1 11/1994

(Continued)

OTHER PUBLICATIONS

Underwriters Laboratories Inc., Standard for Safety, Door, Drapery, Gate, Louver, and Window Operators and Systems, UL325, Fifth Edition, Jun. 7, 2002.

(Continued)

*Primary Examiner* — Tung X Nguyen
*Assistant Examiner* — Thang Le
(74) *Attorney, Agent, or Firm* — Panitch Schwarze Belisario & Nadel LLP

(57) ABSTRACT

A sensing edge for providing a signal to a controller indicating that a forward edge of a door is obstructed during operation includes an elongated sheath and first and second end plugs. The elongated sheath is mounted to the forward door edge and has a first end, second end and first cavity connecting the ends. First and second spaced apart electrically conductive materials are disposed within the elongated sheath. The first end plug includes an inner end having first engaging structures positioned within the first cavity in an assembled configuration and an outer end having a first depression for housing an electronic component. The electronic component is electrically coupled to the electrically conductive materials. The second end plug includes an inner end having a sensing component and second engaging structures positioned within the first cavity in an assembled configuration. The sensing component is electrically coupled to the electrically conductive materials.

15 Claims, 4 Drawing Sheets

(56) References Cited

U.S. PATENT DOCUMENTS

| | | | | |
|---|---|---|---|---|
| 4,396,814 A | | 8/1983 | Miller | |
| 4,772,216 A | | 9/1988 | Szymanek | |
| 4,785,143 A | | 11/1988 | Miller | |
| 4,908,483 A | | 3/1990 | Miller | |
| 4,954,673 A | | 9/1990 | Miller | |
| 4,972,054 A | | 11/1990 | Miller et al. | |
| 5,023,411 A | | 6/1991 | Miller et al. | |
| 5,027,552 A | | 7/1991 | Miller et al. | |
| 5,079,417 A | * | 1/1992 | Strand | 250/221 |
| 5,087,799 A | * | 2/1992 | Pariot et al. | 200/61.43 |
| 5,225,640 A | | 7/1993 | Miller et al. | |
| 5,260,529 A | | 11/1993 | Miller | |
| 5,297,360 A | | 3/1994 | Besore et al. | |
| 5,345,671 A | | 9/1994 | Miller | |
| 5,399,851 A | * | 3/1995 | Strand | 250/222.1 |
| 5,418,342 A | | 5/1995 | Miller | |
| 5,426,293 A | | 6/1995 | Miller et al. | |
| 5,438,798 A | * | 8/1995 | Plamper et al. | 49/28 |
| 5,620,039 A | * | 4/1997 | Delgado et al. | 160/265 |
| 5,728,984 A | | 3/1998 | Miller | |
| 5,839,227 A | | 11/1998 | Gardner | |
| 5,962,825 A | | 10/1999 | Miller | |
| 6,078,014 A | * | 6/2000 | Kashiwazaki et al. | 200/61.43 |
| 6,178,094 B1 | | 1/2001 | Hakozaki | |
| 6,199,321 B1 | | 3/2001 | Ginzel | |
| 6,286,257 B1 | | 9/2001 | Gregoriou et al. | |
| 6,339,305 B1 | * | 1/2002 | Ishihara et al. | 318/445 |
| 6,484,360 B1 | | 11/2002 | DeBartolo, Jr. et al. | |
| 6,571,512 B1 | * | 6/2003 | Miller et al. | 49/27 |
| 6,600,113 B1 | | 7/2003 | Miller | |
| 6,651,385 B2 | | 11/2003 | Miller et al. | |
| 6,683,296 B2 | | 1/2004 | Miller et al. | |
| 6,723,933 B2 | | 4/2004 | Haag et al. | |
| 6,920,717 B2 | | 7/2005 | Miller et al. | |
| 6,955,079 B2 | * | 10/2005 | Ishihara et al. | 73/114.01 |
| 7,299,847 B1 | * | 11/2007 | Evans | 160/1 |
| 7,373,754 B2 | * | 5/2008 | Albiero | 49/27 |
| 7,525,062 B2 | | 4/2009 | Adam et al. | |
| 7,603,813 B2 | | 10/2009 | Hackl | |
| 2005/0001573 A1 | | 1/2005 | Miller et al. | |
| 2006/0113172 A1 | * | 6/2006 | Sugimori et al. | 200/85 R |
| 2006/0192682 A1 | * | 8/2006 | Miller | 340/686.1 |
| 2007/0068787 A1 | * | 3/2007 | Burgess et al. | 200/512 |
| 2010/0154311 A1 | * | 6/2010 | Condon et al. | 49/358 |
| 2010/0307065 A1 | | 12/2010 | Eckartsberg | |
| 2012/0079898 A1 | | 4/2012 | Castello et al. | |

FOREIGN PATENT DOCUMENTS

| | | |
|---|---|---|
| DE | 20013310 U1 | 12/2000 |
| GB | 2323214 A | 9/1998 |

OTHER PUBLICATIONS

Miller Edge Custom Hangar Door Edges Brochure, 8 pages.
Miller Edge Sensing Edges Brochure, 12 pages.
Office Action issued Jul. 18, 2013 in U.S. Appl. No. 13/247,425.
Office Action issued Dec. 6, 2013 in U.S. Appl. No. 13/247,425 by Castello.
Extended European Search Report issued Jun. 25, 2014 in EP Application No. 11183864.5.
Extended European Search Report issued Jun. 25, 2014 in EP Application No. 11183873.6.

* cited by examiner

RESISTOR STORAGE CAVITY IN PLUG OF SENSING EDGE

CROSS-REFERENCE TO RELATED APPLICATIONS

This application claims priority to U.S. Provisional Patent Application No. 61/389,786, filed Oct. 5, 2010, which is incorporated herein by reference in its entirety.

BACKGROUND OF THE INVENTION

Preferred embodiments of the present invention relate to the placement of an electronic element, such as a resistor or diode in an end plug of the terminal end of the sensing edge (i.e., the end which is not connected to the control mechanism for the motor of the automatic door). The input end of the sensing edge is the end which is connected to the control mechanism. Sensing edges for automatic doors are generally well known. A description of sensing edges can be found, for example, in U.S. Pat. No. 6,571,512, titled "Universal Sensing Edge with Non-Melt End Closure," and which disclosure is incorporated by reference herein in its entirety.

Sensing edges generally include an elongated sheath configured to sense force. Upon an application of a force to the sheath, the elongated sheath actuates suitable control circuitry for controlling movement of a door. For example, an automatic door can have a sensing edge on a leading or bottom edge. If an object is below the elongated sheath, the elongated sheath is pressured by the object when the automatic door impacts the object when closing. Such force is "sensed" by the elongated sheath, which results in a predetermined signal being sent to a mechanism which opens or closes the automatic door to cause the automatic door to stop moving to prevent damage to the object or the door.

One way for the elongated sheath to sense force is to have first and second spaced apart electrically conductive materials extending in a longitudinal direction of the elongated sheath. The electrically conductive materials are electrically connected, on an input end of the sensing edge, to the control circuitry which controls the movement of the door. The other end (i.e., the terminal end) of the electrically conductive materials is often not electrically connected to anything, and the electrically conductive materials are often not connected to each other at the terminal end. Thus, there is no closed circuit, and therefore no electricity flows through the electrically conductive materials. Once force is applied to the elongated sheath, it causes the first and second electrically conductive materials to connect to each other, closing the circuit and allowing current to flow. The control circuitry, or other device connected to the control circuitry, senses the change from having no current flowing, to having current flowing, signaling that the automatic door has engaged an object which has put pressure on the elongated sheath. The control circuitry then stops or opens the automatic door.

A problem with the above system is that in the "standby" mode of operation, no current is flowing through the electrically conductive materials. Thus, if the system is damaged, such as, for example, by at least one of the electrically conductive materials being cut, the system may not be able to carry a current even if pressure is applied to the elongated sheath. The control circuitry then "senses" that no current is flowing and takes no action to stop or close the automatic door, even if an undesired object has been engaged. One technique for solving this problem is disclosed in U.S. Pat. No. 5,345,671, titled "Process of Making a Sensing Edge With a Failsafe Sensor," the disclosure of which is incorporated by reference herein in its entirety. In this technique, the terminal end is connected to an electronic component (resistor, diode or the like), such that the electronic component electrically connects the first and the second electrically conductive materials together, thereby providing three possible current states (e.g., no current, low current and high current).

Such systems typically include the electronic component beyond an end plug of the sensing edge, and the electrically conductive materials must be electrically connected with the electronic component. Accordingly, it is desirable to more simply and efficiently add an electronic component to the sensing edge circuit.

BRIEF SUMMARY OF THE INVENTION

In one embodiment, a sensing edge for providing a signal to a controller indicating that a forward edge of a door is obstructed during operation is disclosed. The sensing edge includes an elongated sheath, a first end plug and a second end plug. The elongated sheath includes a first end, a second end and a first cavity connecting the first and second ends. The elongated sheath is mounted to the forward door edge. First and second spaced apart electrically conductive materials are disposed within the elongated sheath. The first end plug includes an inner end having first engaging structures extending therefrom. The first engaging structures are positioned within the first cavity in an assembled configuration. The outer end of the first end plug has a first depression for housing an electronic component. The electronic component is electrically coupled to the first and second electrically conductive materials. The second end plug includes an inner end having a sensing component and second engaging structures extending therefrom. The second engaging structures are positioned within the first cavity in an assembled configuration. The sensing component is electrically coupled to the first and second electrically conductive materials.

In another embodiment, an end assembly for a sensing edge for providing a signal to a controller indicating that a forward edge of a door is obstructed during operation is disclosed. The end assembly includes a first end plug, an electronic component and a conductive tongue. The first end plug has an inner end and an outer end. First engaging structures extend from the inner end of the first end plug. The outer end of the first end plug defines an outer plane and has a first depression and a horizontal groove. The electronic component is positioned within the depression of the first end plug. The conductive tongue is positioned on the inner end of the first end plug.

BRIEF DESCRIPTION OF THE DRAWINGS

The following detailed description of the invention, will be better understood when read in conjunction with the appended drawings. For the purpose of illustrating the invention, there is shown in the drawings an embodiment which is presently preferred. It should be understood, however, that the invention is not limited to the precise arrangements and instrumentalities shown. In the drawings.

DETAILED DESCRIPTION OF THE INVENTION

Figure 1:
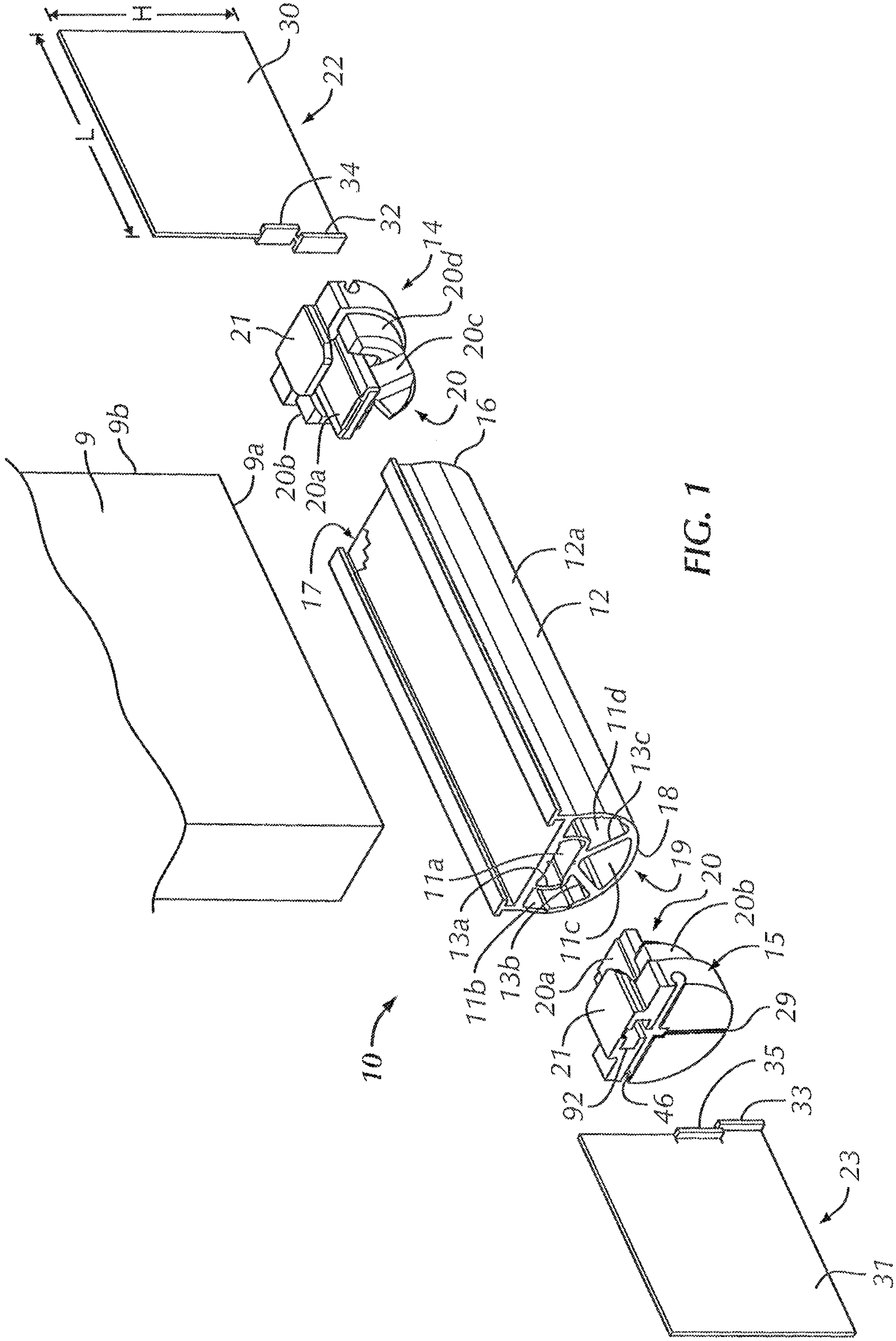
FIG. 1 is a perspective lateral exploded view of a sensing edge according to a preferred embodiment of the present invention.

Certain terminology is used in the following description for convenience only and is not limiting. The words "right," "left," "lower," and "upper" designate directions in the drawings to which reference is made. The words "inwardly," "inner," "distally," "outer," "outwardly," or "proximally" refer to directions toward and away from, respectively, the geometric center or orientation of the device and related parts thereof. The terminology includes the above-listed words, derivatives thereof and words of similar import.

Referring to FIGS. 1-4, a sensing edge 10 in accordance with a preferred embodiment of the present invention includes an elongated sheath 12, a first end plug 14, a second end plug 15, and optional first and second end flaps 22, 23. The sensing edge 10 is preferably mounted to a door, gate or other structure 9 that opens and/or closes upon actuation by a user. The door 9 is typically driven to open or close by a driving motor (not shown) upon remote actuation by the user. The door 9 comprises a garage door 9, a gate 9 or nearly any door or structure that opens and/or closes based upon actuation by the user. The sensing edge 10 is preferably mounted to the door 9 to provide a signal to a controller (not shown) indicating that an edge, preferably a forward edge 9*a* of the door 9 is obstructed during an opening or closing operation. The sensing edge 10 preferably prevents the door 9 from damaging an object that obstructs the opening and/or closing path of the door 9 by sensing the object when the sensing edge 10 comes into contact with the object during use. Accordingly, the sensing edge 10 is preferably mounted to an edge 9*a* of the door 9 that may come into contact with an object during opening and/or closing. For example, the sensing edge 10 may be mounted to the bottom or forward edge 9*a* of a garage door 9 such that the sensing edge 10 comes into contact with objects or people that may obstruct the opening and/or closing of the door 9, as would be understood by one having ordinary skill in the art. The sensing edge 10 is not limited to being mounted to the bottom or forward edge of the door 9 and may be mounted to a side edge 9*b* of the door 9, particularly for a door 9 that opens or closes by travelling laterally on a track (not shown), as opposed to a traditional garage or overhead door 9 that generally opens and closes along a generally vertical path. Accordingly, the sensing edge 10 is preferably mounted to the door 9 along an edge where it may come into contact with an object during the opening and/or closing operations, which may be described as the forward edge 9*a* of the door 9.

The elongated sheath 12 of the sensing edge 10 of the preferred embodiment has a first end 16 and a second end 18. In the preferred embodiment, the elongated sheath 12 is relatively hollow between the first and second ends 16, 18. The elongated sheath 12 is not limited to being hollow between the first and second ends 16, 18 and may be relatively solid or may have a variety of structures between the first and second ends 16, 18 depending upon design considerations of the preferred sensing edge 10. The elongated sheath 12 of the preferred embodiment includes an outer wall 12*a* and first, second and third ribs 13*a*, 13*b*, 13*c* extending from the first end 16 to the second end 18. The outer wall 12*a* and first, second and third ribs 13*a*, 13*b*, 13*c* define first, second, third and fourth voids 11*a*, 11*b*, 11*c*, 11*d* at least at the first and second ends 16, 18. The first, second and third ribs 13*a*, 13*b*, 13*c* provide a stiffness to the elongated sheath 12 to retain the general shape of the sheath 12 and to transmit forces to sensors (not shown) associated with the sheath 12. The first, second and third ribs 13*a*, 13*b*, 13*c* are preferably co-molded or co-extruded with the outer wall 12*a* to form the sheath 12. The sheath 12 is not limited to inclusion of the outer wall 12*a* and first, second and third ribs 13*a*, 13*b*, 13*c* and may be otherwise constructed. For example, the elongated sheath 12 may be constructed without inclusion of the first, second and third ribs 13*a*, 13*b*, 13*e* such that the elongated sheath 12 is hollow between the first and second ends 16, 18 and the outer wall 12*a* defines a single void (not shown) therein. However, the first, second and third ribs 13*a*, 13*b*, 13*c* are preferred to provide strength and stiffness to the elongated sheath 12 to assist in retaining the preferred shape of the sheath 12 and to transmit forces to sensors within the sheath 12 when the sheath 12 impacts an object during opening or closing of the door 9.

In the preferred embodiment, the engaging structures 20 of the first and second end plugs 14, 15 are generally identical and are described as such herein. However, the engaging structures 20 of the first and second end plugs 14, 15 are not necessarily identical and may be designed and configured based upon user preferences for mounting to the first and second ends 16, 18 and/or for connecting or engaging sensors (not shown) related to the sensing edge 10. The first engaging structures 20 of the preferred embodiment include a first projection 20*a*, a second projection 20*b*, a third projection 20*c* and a fourth projection 20*d*. The first projection 20*a* is positioned within the first void 11*a*, the second projection 20*b* is positioned within the second void 11*b*, the third projection 20*c* is positioned within the third void 11*c* and the fourth projection 20*d* is positioned within the fourth void 11*d* in the assembled configuration. Preferably, the first projection 20*a* is removably coupled with the first end plug 14 and the second end plug 15. The first, second, third and fourth projections 20*a*, 20*b*, 20*c*, 20*d* are preferably sized and configured for force-fitting into the first, second, third and fourth voids 11*a*, 11*b*, 11*c*, 11*d*, respectively, in the assembled configuration. The first, second, third and fourth projections 20*a*, 20*b*, 20*c*, 20*d* are not limited to being force-fit into the first, second, third and fourth voids 11*a*, 11*b*, 11*c*, 11*d* and may be otherwise sized and configured such that the first and second end plugs 14, 15 are mounted to the first and second ends 16, 18 when the projections 20*a*, 20*b*, 20*c*, 20*d* engage the voids 11*a*, 11*b*, 11*c*, 11*d*. The projections 20*a*, 20*b*, 20*c*, 20*d* may be maintained in the voids 11*a*, 11*b*, 11*c*, 11*d* by the force fit or may also be secondarily engaged with the elongated sheath 12 by fastening, adhesively bonding or otherwise securing the first and second end plugs 14, 16 to the first and second ends 16, 18. The engagement structure 20 is not limited to inclusion of the projections 20*a*, 20*b*, 20*c*, 20*d*, as described and shown in the figures and the sheath 12 is not limited to inclusion of the voids 11*a*, 11*b*, 11*c*, 11*d* as described and shown in the figures.

Figure 5:
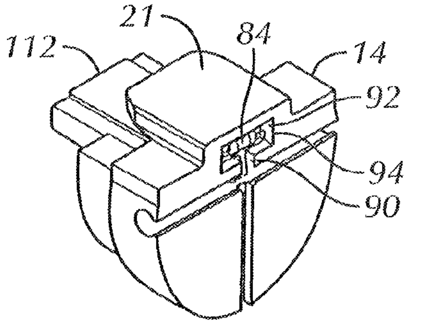
FIG. 5 is a lateral perspective view of the end plug shown in FIG. 1, further containing an electronic component.
Figure 6:
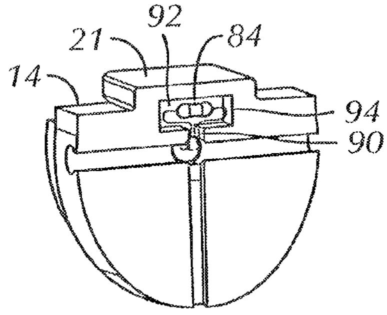
FIG. 6 is a lateral perspective view of the end plug shown in FIG. 5.
Figure 7:
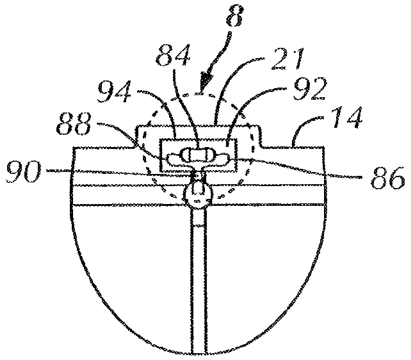
FIG. 7 is a side elevational view of the end plug shown in FIG. 5.
Figure 9:
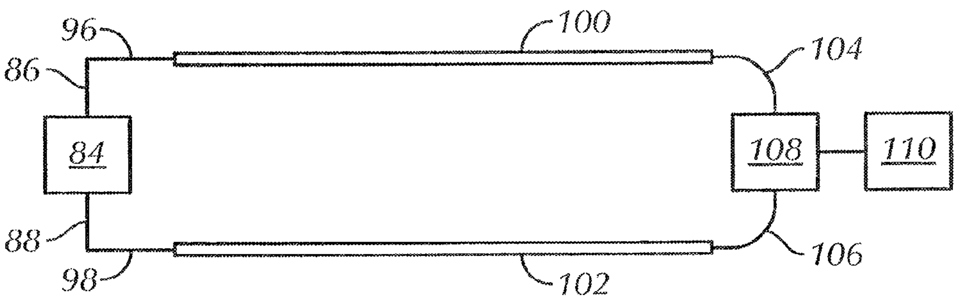
FIG. 9 is a schematic block diagram of electrical connections of the preferred embodiment of the present invention.

The engaging structures 20 of the first and second end plugs 14, 16 also preferably include a top projection 21 that does not extend into any of the voids 11*a*, 11*b*, 11*c*, 11*d* of the elongated sheath 12 in the assembled configuration. The top projection 21 extends above the first void 11*a* to create consistent contact between the outer wall 12*a* and the first projection 20*a*. In the preferred embodiment, the first projection 20*a* is a conductive component that transmits signals to and from the conductive materials 100, 102 (FIG. 9). For example, the first projection 20*a* may be a conductive tongue 112 as described with respect to FIG. 5 below. Accordingly, consistent contact between the outer wall 12*a* and the first projection 20*a* is preferred to facilitate transmission of the signals between the first projection 20*a* and the outer wall 12*a*. The top projection 21 maintains this contact between the outer wall 12*a* and the first projection 20*a* by preventing the outer wall 12*a* from buckling or ballooning away from the first projection 20*a* in the assembled configuration. The first and second end plugs 14, 15 are not limited to inclusion of the top projection 21 as shown in the preferred embodiment and may function without the top projection 21 or may include a projection that is otherwise configured for maintaining contact between the outer wall 12*a* and the first projection 20*a*.

The elongated sheath 12 of the preferred embodiment includes a first cavity 17 at the first end 16 and a second cavity 19 at the second end 18. In the assembled configuration, the engaging structures 20 of the first and second end plugs 14, 15 are mounted in the first and second cavities 17, 19 respectively. Positioning of the engaging structures 20 in the first and second cavities 17, 19 at least partially secures the first and second end plugs 14, 15 to the elongated sheath 12. In the preferred embodiment, the first and second end plugs 14, 15, first and second cavities 17, 19 and first and second end flaps 22, 23 have substantially the same structure and configuration and are described throughout the application with the understanding that these structures are substantially the same, but are not so limited.

The first end flap 22 is preferably slidingly engaged with the end plug 14. An adhesive or other fastening device may also be used to secure the end plug 14 to the elongated sheath 12. The first end flap 22 preferably has a substantially rectangular shape, with one or more corners optionally having rounded shapes. The length of the elongated sheath 12 is not drawn to scale in FIG. 1, and is of a length appropriate for attachment to the entire length of the door 9 onto which the sensing edge 10 will be attached. The first end plug 14 and the second end plug 15 may have the same or a different structure, depending upon the design and/or configuration of the sensing edge 10. However, while the first end plug 14 maintains an electronic component 84 in a depression 92 as described further below, the second end plug 15 does not include such an electronic component in the depression 92.

The first end flap 22, first end plug 14, and elongated sheath 12 are preferably constructed of a flexible material, such as rubber, silicon or the like, but is preferably constructed from Polyvinyl chloride ("PVC"). The PVC may be made more flexible or stiffer depending on the application of the sensing edge 10. The first end flap 22, elongated sheath 12, and first end plug 14 are configured such that when the elongated sheath 12 is attached to the bottom, forward or leading edge of the automatic door 9, the first end flap 22 is positioned in a space between the first end plug 14 and a wall or other structure (not shown) adjacent to the side of the automatic door 9, in order to block light and/or animals from entering around the side edge of the door 9. The first end flap 22 includes a first body or flat portion 30, which is preferably comprised of a thin, planar structure and preferably defines a plane which is substantially parallel to a plane defined by the automatic door 9 when the sensing edge 10 is attached to the automatic door 9. This way, the first end flap 22 blocks the space adjacent to the first end plug 14 to block light and animals or other objects or substances from entry. Typically, the automatic door 9 is substantially vertical, and the first body 30 extends substantially vertically as well.

Figure 2:
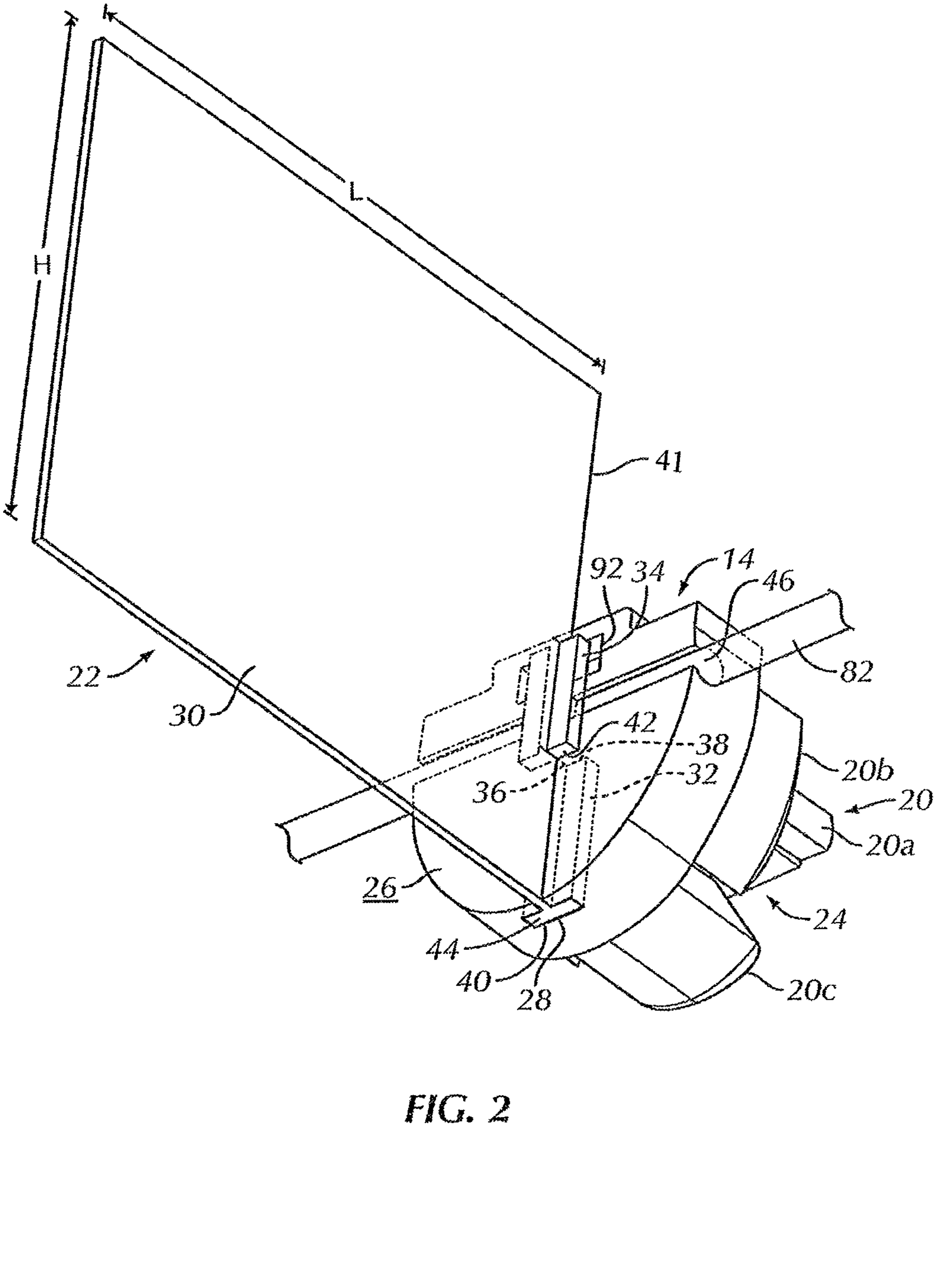
FIG. 2 is a perspective lateral view of an end plug and an end flap of the sensing edge shown in FIG. 1.

Referring to FIG. 2, the first end plug 14 of the preferred embodiment includes an inner or first end 24 which includes the first engaging structures 20, and an outer or second end 26 which is configured to engage the first end flap 22. The first end flap 22 has a body length L and a body height H. The first end plug 14 includes a first vertical groove 28 in the outer end 26 designed to engage a portion of the first end flap 22 in order to attach the first end flap 22 to the first end plug 14. In the preferred embodiment, the first vertical groove 28 is an elongated groove having a T-shaped cross-section.

The first end flap 22 includes the first body 30, a first flange structure 32 and, preferably, a second flange structure 34. The first and second flange structures 32, 34 are located at a first edge 41 of the first end flap 22 which faces the outer end 26 of the first end plug 14 when engaged therewith. The first flange structure 32 is preferably located on a step portion 36 of the first end flap 22. When in use, the vertical T-shaped groove 28 of the first end plug 14 typically extends longitudinally in a substantially vertical direction and the first end flap 22 extends in a substantially vertical direction in the assembled configuration. The first end flap 22 engages with the first end plug 14 by inserting a first end 38 of the first flange structure 32 into a lateral opening 40 of the first end plug 14. The first flange structure 32 of the first end flap 22 is preferably secured in the vertical T-shaped groove 28 with preferably little or no extension of a second end 44 of the first flange structure 32 outside of the vertical T-shaped groove 28. In the engaged position, preferably the second flange structure 34 partially or fully closes the depression 92.

Referring to FIG. 1, the second end plug 15 includes a second vertical groove 29, similar to the first vertical groove 28 of the first end plug 14. The optional second end flap 23 preferably includes a relatively flat or planar second body 31 and a third flange structure 33. The third flange structure 33 is preferably positioned in the second vertical groove 29 in the assembled configuration to secure the second end flap 23 to the second end plug 15. The second end flap 23 also preferably includes a fourth flange structure 35 having a T-shaped cross-section similar to the second flange structure 34 of the first end flap 22. The fourth flange structure 35 partially or fully closes the depression 92.

Figure 3:
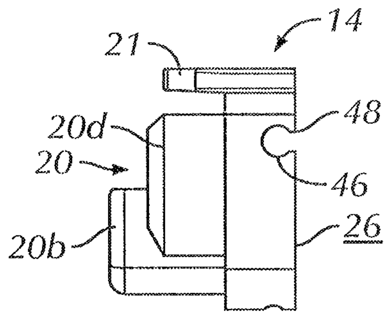
FIG. 3 is a front elevational view of the end plug shown in FIG. 1.
Figure 4:
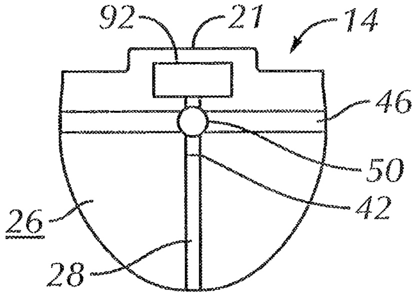
FIG. 4 is a side elevational view of the end plug shown in FIG. 1.

Referring to FIGS. 3 and 4, the first end plug 14 preferably includes a horizontal groove 46 formed substantially perpendicular to a direction defined by the length of the vertical T-shaped groove 28. The horizontal groove 46 has a C-shaped cross-section in the preferred embodiment such that it is open along the outer end 26. Such a shape allows an electric wire or cable 82 (FIG. 2), especially a sheathed cable, to be secured inside the circular groove 46 and held in place. The electric wire 82 is generally cylindrical in shape and relatively flexible along its length. The electrical wire 82 is preferably mounted in the horizontal groove 46 by pushing the electric wire 82 laterally through the opening 48 of the horizontal groove 46 with sufficient force to elastically deform the opening 48 and/or wire 82 to permit the wire 82 to be inserted into the circular groove 46. When the electrical wire 82 is fully positioned in the horizontal groove 46, the wire 82 and opening 48 preferably return to their original shapes. The horizontal groove 46 is preferably positioned on an opposite side of the wall structure 42 as the vertical groove 28, such that the first flange structure 32 is not positioned inside the circular groove 46. The electrical wire 82 provides power and/or carries electrical signals to the components of the sensing edge 10 that sense engagement of the elongated sheath 10 with objects in the path of travel of the door 9. Securing the electrical wire 82 in the horizontal groove 46 generally fastens the electrical wire 82 relative to the door 9 to limit damage to the electrical wire 82 during use.

The first end plug 14 also includes a passage 50 (FIG. 4), which extends into the first end plug 14 to permit the electrical wire 82 to extend into the first end plug 14. The electrical wire 82 can be, for example, used to connect sensors (not shown) in the elongated sheath 12 with the control mechanism (not shown) of the automatic door 9, in order to send signals to the control mechanism generated as a result of force being applied to the elongated sheath 12. The electrical wire 82 preferably extend from the passage 50 and is diverted to the circular groove 46 in a direction away from the passage 50. Preferably, the passage 50 is aligned with the horizontal groove 46 to accommodate fastening of the electrical wire 82 relative to the first end plug 14.

Referring now to FIGS. 5-8, the first end plug 14 includes an electronic component 84 secured in a depression 92 in the outer end 26. The electronic component 84 can be a resistor, diode, or any other device which can affect the resistance, current, and/or voltage between two conductors. In one preferred embodiment, the electronic component 84 is a 10 kilo-ohm resistor; however, a resistor of any suitable ohmage may be used without departing from the scope of this invention.

Figure 8:
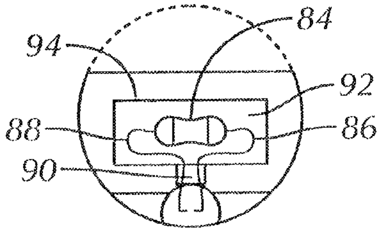
FIG. 8 is a greatly enlarged fragmentary view of a portion of the end plug according to FIG. 7.

Referring to FIG. 8, first and second conductors 86, 88 are electrically coupled to the opposite ends of the electronic component 84. As shown in FIG. 9, the first and second conductors 86, 88 are also electrically coupled to the respective spaced apart first and second electrically conductive materials 100, 102, which extend at least partially along the length of the elongated sheath 12 and preferably to the input end of the sensing edge 10. The first end plug 14, if it contains the electronic component 84, is positioned at the terminal end of the sensing edge 10. The first and second electrically conductive materials 100, 102 are electrically or otherwise operably coupled to the control circuit which controls whether the automatic door 9 stops when the elongated sheath 12 is subjected to unwanted pressure, and are also electrically or otherwise operably coupled to the electronic component 84.

The depression 92 of the first end plug 15 has a shape suitable to receive and retain the electronic component 84. Preferably, the shape is such that the electronic component 84 does not extend past the opening 94 of the depression 92. The electronic component 84 can be secured inside the depression 92 by any means known in the art, such as with adhesives, a mechanical fastener (clip) or the like. The opening 94 can be square, rectangular, or circular, but is preferably rectangular. The first and second conductors 86, 88 which are electrically or otherwise operably connected to the opposite end of the electronic component 84 extend through a notch 90 and then through a passage 50 to the first end 24 in the first end plug 14. After passing through the passage 50, the first and second conductors 86, 88 are electrically or otherwise operably coupled to the first and second electrically conductive materials 100, 102. When the first end flap 22 is engaged with the first end plug 14, the depression 92 is at least partially closed by the flange structure 32, thereby protecting the electronic component 84 from becoming damaged by dust, debris and the like.

The first end plug 14 having the electronic component 84 is placed at the terminal end 18 of the sensing edge 10. The second end plug 15 is placed at the input end of the sensing edge 10 and need not have the electronic component 84 in the depression 92. Though it is preferable that the first end plug 14 and the second end plug 15 have the same structure, it is possible to use different end plugs for the input end of the sensing edge 10 and the terminal end of the sending edge 10. Thus, for example, the second end plug 15 need not have a depression for housing an electronic component.

Referring now to FIG. 9, a block diagram of the electrical connections of the sensing edge 10 is shown. The electronic component 84 is electrically coupled to the first and second conductors 86 and 88, which are respectively coupled to first and second connectors 96, 98, which are, in turn, respectively coupled to the spaced apart first and second electrically conductive materials 100, 102. Preferably, the first and second electrically conductive materials 100, 102 are a conductive polymer material. The first and second connectors 96, 98 may be extensions of the first and second conductors 86, 88, they may form part of a conductive tongue 112 (i.e., the first projection 20*a*), or they may be sheathed wires or any other component or structure to directly or indirectly electrically couple the first and second conductors 86, 88 to the first and second electrically conductive materials 100, 102. The conductive tongue 112 is preferably a rubber-encapsulated pair of wires, having a shape which will partially fit into a groove on the first end 24 of the first end plug 14, and partially fit into the first and/or second ends 16, 18 of the elongated sheath 12. Preferably, the conductive tongue 112 is made from the same conductive material as the conductive materials 100, 102. The first and second electrically conductive materials 100, 102 are, in turn, electrically connected to third and fourth connectors 104, 106, respectively. The third and fourth connectors 104, 106, may be extensions of the first and second electrically conductive materials 100, 102 or they may form part of a conductive tongue, or they may be sheathed wires or any other component or structure to directly or indirectly electrically connect the first and second electrically conductive materials 100, 102 to a sensing component or sensor 108.

The sensor 108 is electronic circuitry that evaluates the amount of current flowing across the third and fourth connectors 104, 106 to determine whether there is unwanted pressure on the elongated sheath 12, whether the sensing edge 10 is not working properly, or whether the sensing edge 10 is operational and there is no unwanted pressure on the elongated sheath 12. For example, if there is no current flow through third and fourth connectors 104, 106, then this may mean that the sensing edge 10 is not working properly. If the current flow is higher than a predetermined amount, or it increases suddenly, this may mean that there is unwanted pressure on the elongated sheath 12. If the current flow is less than a predetermined amount, then this may mean that the sensing edge 10 has no unwanted pressure on elongated sheath 12. Preferably, the sensor 108 includes microprocessor circuitry and a resistor divider network for determining whether there is proper termination at the electronic component 84 in the first end plug 14. The sensor 108 is operably coupled to the control device 110, which is the control circuit that controls the motor which moves the automatic door 9. The automatic door 9 can be opened, closed, or stopped depending on the current that the sensor 108 senses from the third and fourth connectors 104, 106, and on the programming of the control device 110. The sensor 108 and the control device 110 may be part of the same component or may be different components which are electrically or otherwise operably coupled to one another.

As an example, if the automatic door 9 is closing and no unwanted pressure is detected, the door can continue to close. If unwanted pressure is detected, the automatic door may stop (and then optionally open). If the sensing edge 10 is damaged and there is no current, the automatic door may not open or stop if already opening (and then optionally open).

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

The invention claimed is:

1. A sensing edge for providing a signal to a controller indicating that a forward edge of a door is obstructed during operation, the sensing edge comprising:

a) an elongated sheath including:

i) a first end, a second end and a first cavity connecting the first end and the second end, the elongated sheath being mounted to the forward door edge, and ii) first and second electrically conductive materials, disposed and spaced apart within the elongated sheath;

b) a first end plug including:

i) an inner end having first engaging structures extending therefrom, the first engaging structures positioned within the first cavity in an assembled configuration, ii) an outer end surface having a first depression for housing a resistor, the resistor electrically coupled to the first and second electrically conductive materials; and c) a second end plug including an inner end having a sensing component and second engaging structures extending therefrom, the second engaging structures positioned within the first cavity in an assembled configuration, and wherein the sensing component is electrically coupled to the first and second electrically conductive materials and is configured to detect a current flowing through the first and second electrically conductive materials and upon detecting a sudden increase in current flow, or a flow of current greater than a predetermined value, between the first and second electrically conductive materials providing a signal to a controller.

2. The sensing edge of claim 1, wherein the controller sends a signal to a motor based on the current sensed by the sensing component.

3. The sensing edge of claim 1, wherein the first end plug has a passage between the inner and outer ends.

4. The sensing edge of claim 3, wherein the first end plug has a notch in the outer end that allows one or more conductors from the resistor to pass from the depression to the passage.

5. The sensing edge of claim 1, wherein the resistor is electrically coupled to the first and second electrically conductive materials by a conductive tongue.

6. The sensing edge of claim 1 wherein the first end plug includes a first vertical groove extending from an upper surface to a lower surface of the first end plug, the first vertical groove for engaging an end flap that partially closes the first depression.

7. The sensing edge of claim 6 wherein the first end plug also includes a horizontal groove extending generally laterally across the outer end and being open along the entire width of the outer end.

8. The sensing edge of claim 1 wherein the first engaging structures include a first projection, a second projection, a third projection and a fourth projection and the elongated sheath includes a first void, a second void, a third void and a fourth void, the first projection positioned within the first void, the second projection positioned within the second void, the third projection positioned within the third void and the fourth projection positioned within the fourth void in the assembled configuration.

9. An end assembly for a sensing edge for providing a signal to a controller indicating that a forward edge of a door is obstructed during operation, the end assembly comprising:

a first end plug having an inner end, an outer end, first engaging structures extending from the inner end, a first depression in the outer end and a horizontal groove in the outer end, the outer end defining an outer plane;

an electronic component positioned within the depression of the first end plug; and a tongue having electrically conductive planar upper and lower surfaces each being in electrical communication with the electronic component, the upper and lower surfaces extending from the inner end of the first end plug to contact an outer wall of an elongated sheath of the sensing edge for transmission of electric signals therebetween.

10. The end assembly of claim 9, wherein the first end plug has a passage between the inner and outer ends.

11. The end assembly of claim 10, wherein the first end plug has a notch in the outer end that allows one or more conductors from the electronic component to pass from the depression to the passage.

12. The end assembly of claim 11, wherein the electronic component is electrically coupled to the conductive tongue.

13. The end assembly of claim 12, wherein the electronic component is a resistor.

14. The end assembly of claim 12, wherein the electronic component is a diode.

15. The end assembly of claim 12, wherein the horizontal groove extends generally laterally across the outer end and is open along the entire width of the outer end.

* * * * *